(12) United States Patent
Wrobel et al.

(10) Patent No.: US 10,838,386 B1
(45) Date of Patent: Nov. 17, 2020

(54) DISTRIBUTED MODULAR I/O DEVICE WITH CONFIGURABLE SINGLE-CHANNEL I/O SUBMODULES

(71) Applicant: Rockwell Automation Technologies, Inc., Mayfield Heights, OH (US)

(72) Inventors: Adam M. Wrobel, Gates Mills, OH (US); Douglas A. Lostoski, Richfield, OH (US); Daniel E. Killian, Eastlake, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 16/584,132

(22) Filed: Sep. 26, 2019

(51) Int. Cl.
*G05B 19/042* (2006.01)
*G05B 19/05* (2006.01)
(Continued)

(52) U.S. Cl.
CPC ....... *G05B 19/0425* (2013.01); *G05B 19/058* (2013.01); *G06F 11/16* (2013.01); *G06F 13/122* (2013.01); *G05B 2219/1138* (2013.01)

(58) Field of Classification Search
CPC ... G06F 11/16; G06F 13/122; G05B 19/0425; G05B 19/058; G05B 2219/11; G05B 2219/1134; G05B 2219/1138
See application file for complete search history.

(56) References Cited

U.S. PATENT DOCUMENTS 6,425,770 B1   7/2002   Lostoski et al.
6,549,034 B1   4/2003   Pietrzyk et al.
(Continued)

FOREIGN PATENT DOCUMENTS

EP   0 612 205 B1   10/1997

*Primary Examiner* — Glenn A. Auve
(74) *Attorney, Agent, or Firm* — Fay Sharpe LLP

(57) ABSTRACT

An input/output (I/O) device for a distributed modular I/O system includes a base adapted to be connected to an associated support structure. A terminal block is connected to the base and includes a plurality of wiring connections adapted to be connected to field wiring of an associated controlled system. The I/O device further includes first and second I/O modules each including a plurality of removable single-channel I/O submodules that are each releasably connected to the base and each configured for a select I/O operation for input and output of data relative to the associated controlled system. One or more pairs of the single-channel I/O submodules can be configured to be redundant within or between the first and second I/O modules. Each of the single-channel I/O submodules is operatively connected to wiring connections of the terminal block through the base. The I/O device further includes first and second network switches connected to the base. The first and second network switches are adapted to be respectively connected to first and second backplane circuits. The I/O device further includes first and second system modules connected to the base and each respectively connected to both of the first and second network switches. The first and second system modules are also each respectively operatively connected to all of the removable single-channel I/O submodules of both of the first and second I/O modules such that the first and second system modules control communication of I/O data between the first and second network switches and the single-channel I/O submodules.

10 Claims, 5 Drawing Sheets

(51) Int. Cl.
    *G06F 13/12*     (2006.01)
    *G06F 11/16*     (2006.01)

(56) References Cited

U.S. PATENT DOCUMENTS

| | | |
|---|---|---|
| 6,909,923 B2 | 6/2005 | Vasko et al. |
| 7,596,635 B2 | 9/2009 | Siorek et al. |
| 7,602,617 B2 | 10/2009 | Brandt et al. |
| 8,149,554 B2 | 4/2012 | Pietrzyk et al. |
| 8,184,417 B2 | 5/2012 | Pietrzyk et al. |
| 8,441,766 B2 | 5/2013 | Pietrzyk et al. |
| 8,769,158 B2 | 7/2014 | Kretschmann et al. |
| 9,325,110 B2 | 4/2016 | Lostoski et al. |
| 9,861,002 B1 | 1/2018 | Tenorio |
| 10,261,486 B2 | 4/2019 | Bodmann et al. |
| 10,483,663 B2 | 11/2019 | Wrobel et al. |
| 10,631,426 B1 | 4/2020 | Lostoski et al. |
| 2006/0229737 A1* | 10/2006 | Esch ........................ H04L 12/66 700/1 |
| 2007/0016701 A1 | 1/2007 | Siorek et al. |
| 2009/0265493 A1* | 10/2009 | Mendu .................... G05B 9/03 710/107 |
| 2013/0286820 A1* | 10/2013 | Angst .................... H04B 1/745 370/225 |
| 2014/0226460 A1 | 8/2014 | Kretschmann et al. |
| 2015/0270652 A1 | 9/2015 | Lostoski et al. |
| 2015/0362964 A1* | 12/2015 | Correll ..................... G06F 1/26 361/679.4 |
| 2017/0293278 A1* | 10/2017 | Vazach .............. G05B 19/0428 |
| 2017/0344451 A1* | 11/2017 | Vanderah ............ G05B 19/042 |
| 2019/0104633 A1* | 4/2019 | Ross ................... H05K 7/1468 |
| 2020/0050734 A1* | 2/2020 | Schat ................... G06F 30/327 |

\* cited by examiner

DISTRIBUTED MODULAR I/O DEVICE WITH CONFIGURABLE SINGLE-CHANNEL I/O SUBMODULES

FIELD

The present development relates to industrial automation control systems and, more particularly, to a distributed modular input/output (I/O) device with configurable single-channel I/O submodules. The system is adapted to provide enhanced flexibility and fault tolerance as required for certain applications such as a distributed control system (DCS) for process control or for other applications requiring high availability, i.e., a high MTTF (mean time to failure) combined with a low MTTR (mean time to repair).

BACKGROUND INFORMATION

Distributed modular input/output (I/O) systems for industrial automation control systems are well-known and in widespread use. Referring to FIG. 1, a known distributed modular I/O system 10 includes a network adapter 12 that is operatively connected to an industrial automation network N such as an Ethernet/IP network or other industrial automation network so that the network adapter 12 receives data from, transmits data to, and otherwise communicates with an industrial control module or "controller" C also connected to the network N. The controller C comprises one or more programmable logic controllers (PLC), microprocessors, and/or other electronic processors programmed and configured for controlling an industrial machine, process, or other associated controlled system CS.

The adapter 12 includes an adapter base 12a that is mounted to a DIN rail D or other support structure, and an adapter module 12b is permanently or releasably connected to the adapter base 12a. The adapter module 12b includes electronic circuitry for data communication with the controller C via network N and for data communication with multiple I/O devices 20 of the system 10 that are operably connected to the adapter 12 as described below. The adapter 12 comprises one or more network connectors NC for connecting with the network N via known connectors such as RJ45 connectors, Small FormFactor Pluggable (SIP) connectors, or the like. The adapter 12 typically also includes a power input terminal PT for connecting with a source of electrical power for supplying electrical power to the adapter module 12 and to the I/O devices 20 and other components operatively connected to the adapter 12 and/or I/O devices 20.

As noted above, one or more I/O devices 20 are operably connected to the adapter 12 for communication of data between the I/O devices 20 and the adapter 12. The I/O devices 20 each include an I/O base 20a also mounted to the DIN rail D or other support structure, with a first I/O base 20a located adjacent and operably physically and electrically connected to the adapter base 12a by mating first and second multi-contact electrical connectors K located respectively on the I/O base 20a and the adapter base 12a. Additional I/O bases 20a can be operably physically and electrically connected together one after the other in a sequential manner by successive mating first and second multi-contact electrical connectors K located respectively on the adjacent I/O bases 20a such that a modular backplane circuit or backplane network (generally "backplane" and illustrated as a broken line 14) is physically and electrically constructed and adapted for communicating electrical power and data from and between the adapter 12 and each of the successively connected I/O devices 20 such that each I/O device 20 is operably connected through the backplane 14 to the to the network adapter 12 and, thus, to the controller C.

In addition to the I/O base 20a, each I/O device 20 further comprises an I/O module 20b removably or permanently operatively connected to the I/O base 20a such that the installed I/O module 20b also communicates with the network adapter module 12b and the controller C over the backplane 14 whereby input/output data are provided between the controller C and each I/O module 20b via backplane 14. Each installed I/O module 20b is selected and configured with electronic circuitry to perform one or more specialized input/output functions such as DC data input and/or output, AC data input and/or output, analog data input and/or output, Highway Addressable Remote Transducer (HART) input/output, RTD and/or thermocouple input and/or output, or similar industrial machine control and/or process data as is generally known in the field of industrial automation.

Each I/O base 20a further includes a terminal block 20c comprising a plurality of cage clamps, spring clamps, screw terminals, or other wiring connectors 20d that are adapted to be connected to field cables or field wires FW that are each associated with a field device FD that is typically an analog or digital device such as a sensor, flow meter, switch, probe, thermocouple, RTD, encoder, or the like that is associated with the process or machine being controlled (the controlled system CS) by the controller C. The terminal block 20c can be a separate structure that is connected to the I/O base 20a or can alternatively be defined as an integral or one-piece part of the I/O base 20a. Either way, the wiring connectors 20d thereof are electrically connected to the installed I/O module 20b for data communication there between. Different varieties of terminal blocks 20c can be used depending upon the particular configuration required for the field device wiring connectors 20d, with some having different common terminals, ground connections, voltage supply terminals, and the like. The I/O module 20b and wiring terminals 20d of the terminal block 20c of a particular I/O base 20a are in operative connection with each other through a circuit board or other connection in the base 20a. Input/output data are provided between the controller C and field device(s) FD connected to the corresponding I/O base 20a via backplane 14 and the network adapter module 12b. The I/O module 20b implements the above-described I/O functions on multiple different I/O channels, e.g., 8 channels, each of which channels is associated with one or more dedicated wiring connectors 20d (e.g., each channel is associated with a certain column of wiring connectors 20d) of the terminal block 20c connected to the same I/O base 20a.

FIG. 2 is a schematic representation of the distributed modular input/output (I/O) system 10 of FIG. 1. As shown at 20', it is generally known in the art to provide one or more of the I/O devices 20 as a configurable I/O device 20' including multiple individual single-channel I/O submodules 20s1, 20s2, . . . 20sn (generally 20s), that are selectively operatively installed and removed in a releasable manner with respect to the I/O base 20a. The plurality of installed I/O submodules 20s together define an I/O module 20b' that provides the required input/output functionality as described above for the I/O modules 20b of the I/O devices 20. Each installed single-channel I/O submodule 20s includes the required electronic circuitry to implement a single I/O data channel and is operatively respectively connected to one or more dedicated wiring connectors 20d of the associated terminal block 20c connected to the same I/O base 20a. The I/O submodules 20s each include the required electronic circuitry to perform a particular type of I/O operations, such as digital data input/output, analog data input/output, safety data input/output, HART data input/output, RTD data input/output, thermocouple data input/output, and other data input and output with respect to the associated controlled system CS (FIG. 1). As such, the configurable I/O device 20' can be configured or customized as required for a certain application to include the required types and amounts of I/O submodules 20s needed for input and output of data on multiple channels with respect to a particular controlled system CS depending upon the sensors and other field devices FD being used.

Those of ordinary skill in the art will recognize, however, that the known configurable single-channel I/O device 20' does not provide a redundant, fault-tolerant system insofar as the single-channel I/O submodules 20s are concerned. If any one of the single-channel I/O submodules 20s fails, there is no corresponding redundant single-channel I/O submodule 20s provided as part of the same I/O device 20' and operating in parallel with the failed I/O submodule 20s that continues to perform the same I/O operations as the failed submodule 20s to allow for repair or replacement of the failed submodule 20s without interrupting operation of the I/O device 20' and any controlled systems CS operatively connected to the I/O device 20'. Instead, operation of the known I/O device 20' must be interrupted to remove and replace the failed single-channel I/O submodule 20s. This lack of redundancy for known customizable single-channel I/O sub modules 20s is undesirable in many industrial automation control applications, such as distributed control systems for process and plant control where continuous and uninterrupted operation of the controlled process or system is required.

SUMMARY

In accordance with one aspect of the present development, an input/output (I/O) device for a distributed modular I/O system includes a base adapted to be connected to an associated support structure. A terminal block is connected to the base and includes a plurality of wiring connections adapted to be connected to field wiring of an associated controlled system. The I/O device further includes first and second I/O modules each including a plurality of removable single-channel I/O submodules that are each releasably connected to the base and each configured for a select I/O operation for input and output of data relative to the associated controlled system. Each of the single-channel I/O submodules is operatively connected to wiring connections of the terminal block through the base. The I/O device further includes first and second network switches connected to the base. The first and second network switches are adapted to be respectively connected to first and second backplane circuits. The I/O device further includes first and second system modules connected to the base and each respectively connected to both of the first and second network switches. The first and second system modules are also each respectively operatively connected to all of the removable single-channel I/O submodules of both of the first and second I/O modules such that the first and second system modules control communication of I/O data between the first and second network switches and the single-channel I/O submodules.

DETAILED DESCRIPTION

Figure 1:
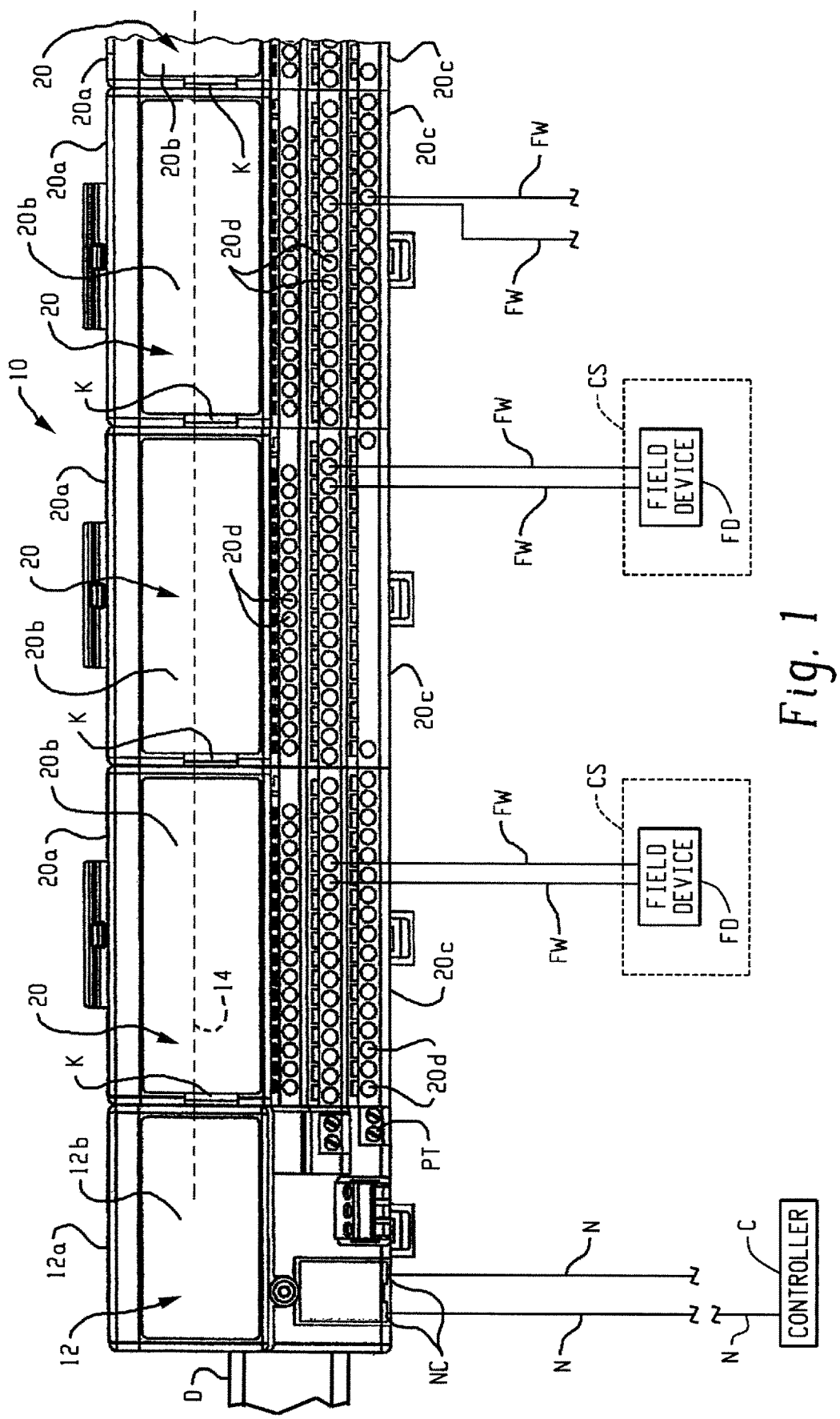
FIG. 1 shows an example of an industrial control system including a known distributed modular input/output (I/O) system.
Figure 2:
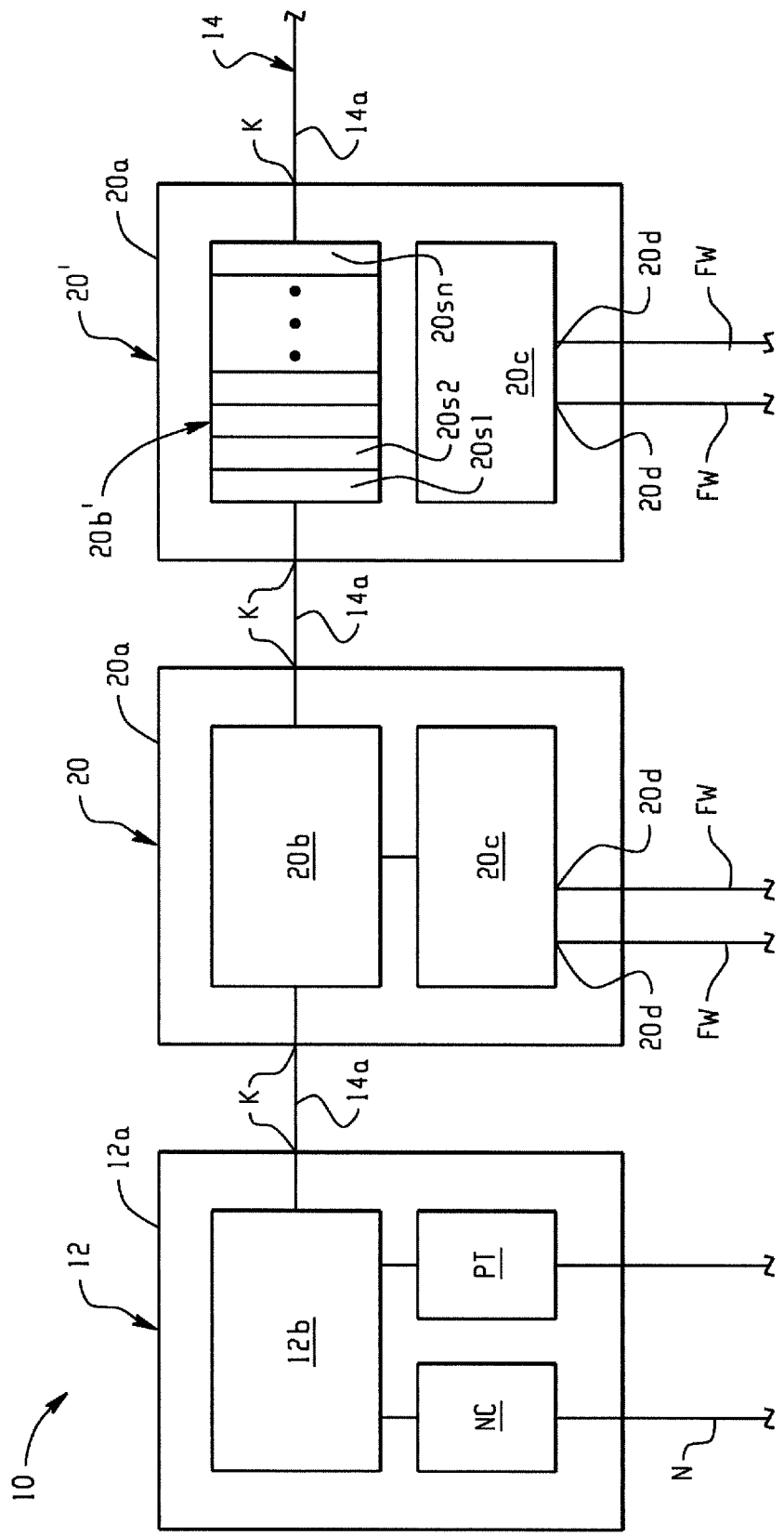
FIG. 2 provides a schematic representation of the known distributed modular input/output (I/O) system of FIG. 1 and further shows a known configurable removable single-channel I/O submodule arrangement.
Figure 3:
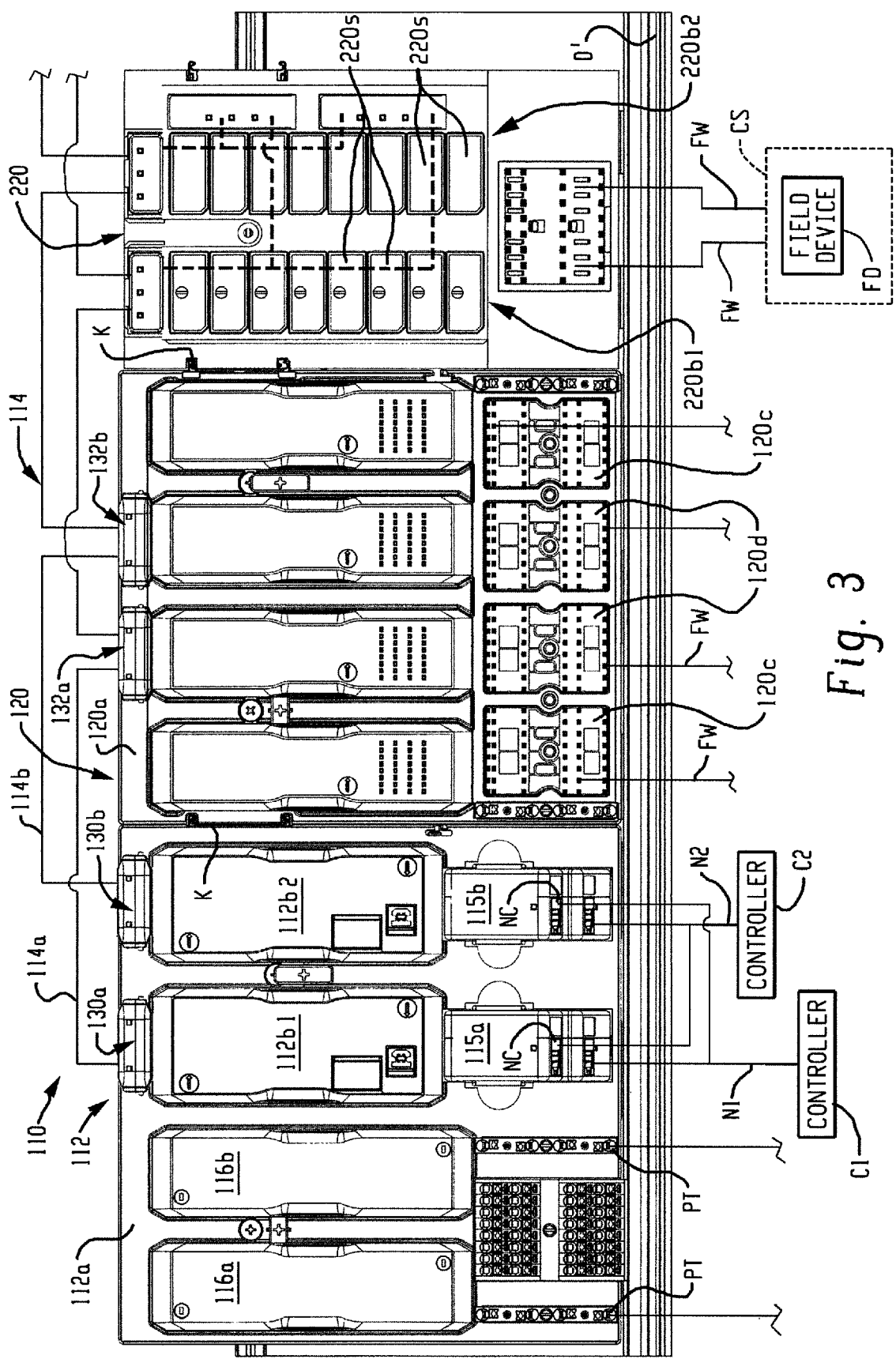
FIG. 3 illustrates a distributed modular input/output (I/O) system formed in accordance with an embodiment of the present development including an example of an I/O device with configurable removable single-channel I/O submodules.

FIG. 3 shows a distributed modular I/O system 110 in accordance with an embodiment of the present development. The distributed modular I/O system 110 includes a network adapter 112 that is operatively connected to at least one industrial automation network N1,N2. As shown herein, the network adapter 112 is connected to first and second redundant industrial automation networks N1,N2 such as first and second Parallel Redundancy Protocol (PRP) LAN networks or the like such as Ethernet/IP networks or other industrial automation networks so that the network adapter 112 receives data from, transmits data to, and otherwise communicates with one or more industrial control modules or "controllers" C1,C2 that are each connected to both of the networks N1,N2. The controllers C1,C2 comprises one or more programmable logic controllers (PLC), microprocessors, and/or other electronic processors for machine and/or process control.

The network adapter 112 includes an adapter base 112a that is mounted to a rail D' or other support structure. The network adapter 112 further comprises first and second identical or otherwise redundant adapter modules 112b1, 112b2 that are operating in parallel with each other and each of which is releasably connected to the adapter base 112a. Each adapter module 112b1,112b2 is operably connected to both the first and second networks N1,N2 by connections in the adapter base 112a and each adapter module 112b1,112b2 includes the electronic circuitry for data communication data with the controllers C1,C2 via networks N1,N2 and for data communication with multiple I/O devices 120 of the system 110 as described below.

In the illustrated embodiment, the adapter 112 includes first and second media landing modules 115a,115b that are removably connected to the adapter base 112a. The first and second media landing boards 115a,115b are operatively connected respectively to the first and second adapter modules 112b1,112b2 through the adapter base 112a. The media landing boards 115a,115b each include at least two network connectors NC such as RJ45 connectors, Small FormFactor Pluggable (SFP) connectors, optical fiber connectors, and/or the like, and the first and second industrial networks N1,N2 are each connected to both of the first and second media landing boards 115a,115b by the network connectors NC such that both of the first and second networks N1,N2 and both of the controllers C1,C2 are operatively connected to both of the first and second adapter modules 112b1,112b2 through the media landing boards 115a,115b.

The network adapter 112 further comprises first and second redundant power conditioning modules 116a,116b connected to the adapter base 112a and each including a power input terminal PT for connecting with at least one source of electrical power such that the power conditioning modules 116a,116b supply system electrical power to the network adapter 112 through the adapter base 112a and to the I/O devices 120 and other components operatively connected to the adapter 112 and/or I/O devices 120 through the backplane 114. As shown herein the power input terminals PT are removably connected to the adapter base 112a and are operably connected to the respective power conditioning modules 116a,116b through the adapter base 112a.

The I/O system 110 further comprises one or more I/O devices 120 (only one shown) that each include an I/O base 120a also mounted to the support rail D' or other support structure, with a first I/O base 120a located adjacent and operably physically and electrically connected to the adapter base 112a by first and second mating multi-contact electrical connectors K located respectively on the I/O base 120a and adapter base 112a. Additional I/O bases 120a are operably physically and electrically connected together one after the other in a sequential manner by successive mating of first and second multi-contact electrical connectors K of the adapter base 112a and/or I/O base 120a such that a modular backplane circuit or backplane network (generally a "backplane" and schematically illustrated at 114) is physically and electrically constructed and adapted for communicating system electrical power and data to and between the adapter 112 and the connected I/O devices 120 and, thus, to the first and second industrial networks N1,N2 and the first and second controllers C1,C2. To facilitate an understanding of the present development, FIG. 3 schematically shows the backplane 114 as being external to the I/O device 110, but those of ordinary skill in the art will recognize that the backplane circuit or network 114 is physically and electrically constructed within and extends through printed circuit boards and other circuitry located in the adapter bases 112a and the successively connected I/O bases 120a via mated connectors K.

In addition to the I/O base 120a, the I/O device 120 further comprises at least two I/O modules 120b (shown herein as four I/O modules 120b1,120b2,120b3,120b4) operatively removably connected to the I/O base 120a in respective mounting slots via electrical connectors such that each of the installed I/O modules 120b is operatively connected to the backplane 114 and communicates with the network adapter 112 and the first and second controllers C1,C2 over the backplane 114 whereby input/output data are provided between the controllers C1,C2 and each I/O module 120b. Each installed I/O module 120b is selected and configured to perform one or more specialized input/output data and signal functions such as DC input, DC output, AC input, AC output, safety input/output, HART input/output, RTD and/or thermocouple input and/or output, or other analog or digital input/output. In one embodiment, at least two of the I/O modules 120b are identical to each other and operated in parallel with each other to provide a redundancy with respect to each other.

Each I/O base 120a further includes at least one terminal block 120c comprising a plurality of cage clamps, spring clamps, screw terminals, or other wiring connectors 120d that are adapted to be connected to field cables or field wires FW that are each associated with a field device FD that is typically an analog or digital device such as a sensor, flow meter, switch, probe, thermocouple, RTD, encoder, or the like that is associated with the process or machine being controlled (the associated controlled system CS) by the controllers C1,C2. Each terminal block 120c can be a separate structure that is assembled to the I/O base 120a or can alternatively be defined as an integral or one-piece part of the I/O base 120a. Different varieties of terminal blocks 120c can be used depending upon the particular configuration required for the field device wiring connectors 120d, with some having different common terminals, ground connections, voltage supply terminals, and the like. Each installed I/O module 120b communicates with the field device wiring connectors 120d of the terminal block 120c connected to the same I/O base 120a on which the I/O module 120b is physically installed. Input/output data are provided between the controllers C1,C2 and field device(s) FD connected to the corresponding I/O base 120a via backplane 114 and the network adapter modules 112b1, 112b2. In the case where two of the installed I/O modules 120b are configured to be operated in parallel and redundant with respect each other, those redundant I/O modules will share a common terminal block 120c such that the redundant I/O modules 120b3,120b4 are operably connected to the same field wiring FW to send data to and receive data from the controlled system CS.

The network adapter 112 includes first and second independent "adapter" Ethernet switches 130a,130b that each are operably connected to, form part of, and establish the backplane 114. Similarly, each I/O device 120 includes first and second independent "I/O module" Ethernet switches 132a,132b that each are operably connected to, form part of, and establish the backplane 114. The switches 130a,130b (generally 130) of the network adapter 112 and the switches 132a,132b (generally 132) of each I/O module 120 can be and are identical in the present embodiment but they are numbered differently herein to facilitate the description of their operation. In each case, the Ethernet switches 130,132 perform a packet switching operation that directs Ethernet network traffic from an input port of the switch to a particular output port of the same switch using an address such as the Media Access Control address(es) (MAC addresses) of the device(s) connected to the output port of the switch 130,132. As used herein, the term "Ethernet switch" is intended to encompass any multi-port Ethernet network device that maps/directs network data from a first (input) port on the switch device 130,132 to a second (output) port on the switch device 130,132 using information contained in the network data that describes the intended destination for the network data. Although the present development is described with reference to an Ethernet-based backplane 114, any other suitable backplane network/protocol can be used.

With respect to the network adapter 112, each Ethernet switch 130 is physically connected to the adapter base 112a, preferably by a releasable mechanical connection such as a slot with a connector or the like. Likewise, with respect to each I/O device 120, each Ethernet switch 132 is physically connected to the I/O base 120a, preferably by a releasable mechanical connection such as a slot with a connector or the like. For both the network adapter 112 and each I/O device 120, each Ethernet switch 130,132 is operably connected to the backplane 114 for communication of data on the backplane 114. The switches 130a,130b can be powered by a separate electrical power connection through the bases 112a, 120a and/or using a Power over Ethernet (PoE) connection or other power delivery method through the backplane network 114, itself. The first and second Ethernet switches 130a,130b of the network adapter 112 respectively establish and maintain first and second Ethernet backplane networks 114a,114b that are completely redundant and independent with respect to each other.

The first and second Ethernet switches 132a,132b of each I/O device 120 are each operatively connected through the I/O base 120a to each installed I/O module 120b (120b1, 120b2,120b3,120b4) for data communication there between.

Because the first and second backplane circuits/backplane networks 114a,114b are physically constructed through the bases 112a,120a and connectors K, the first adapter Ethernet backplane switch 130a and the first I/O device Ethernet backplane switches 132a of the successive I/O devices 120 are connected together in a serial or daisy-chain manner through the adapter 112 and the successively adjacent I/O devices 120 to form the first backplane 114a. Similarly, the second adapter Ethernet backplane switch 130b and the second I/O device backplane switches 132a of the successive I/O devices 120 are connected together in a serial or daisy-chain manner through the adapter 112 and the successively adjacent I/O devices 120 to form the second backplane 114b.

Figure 4:
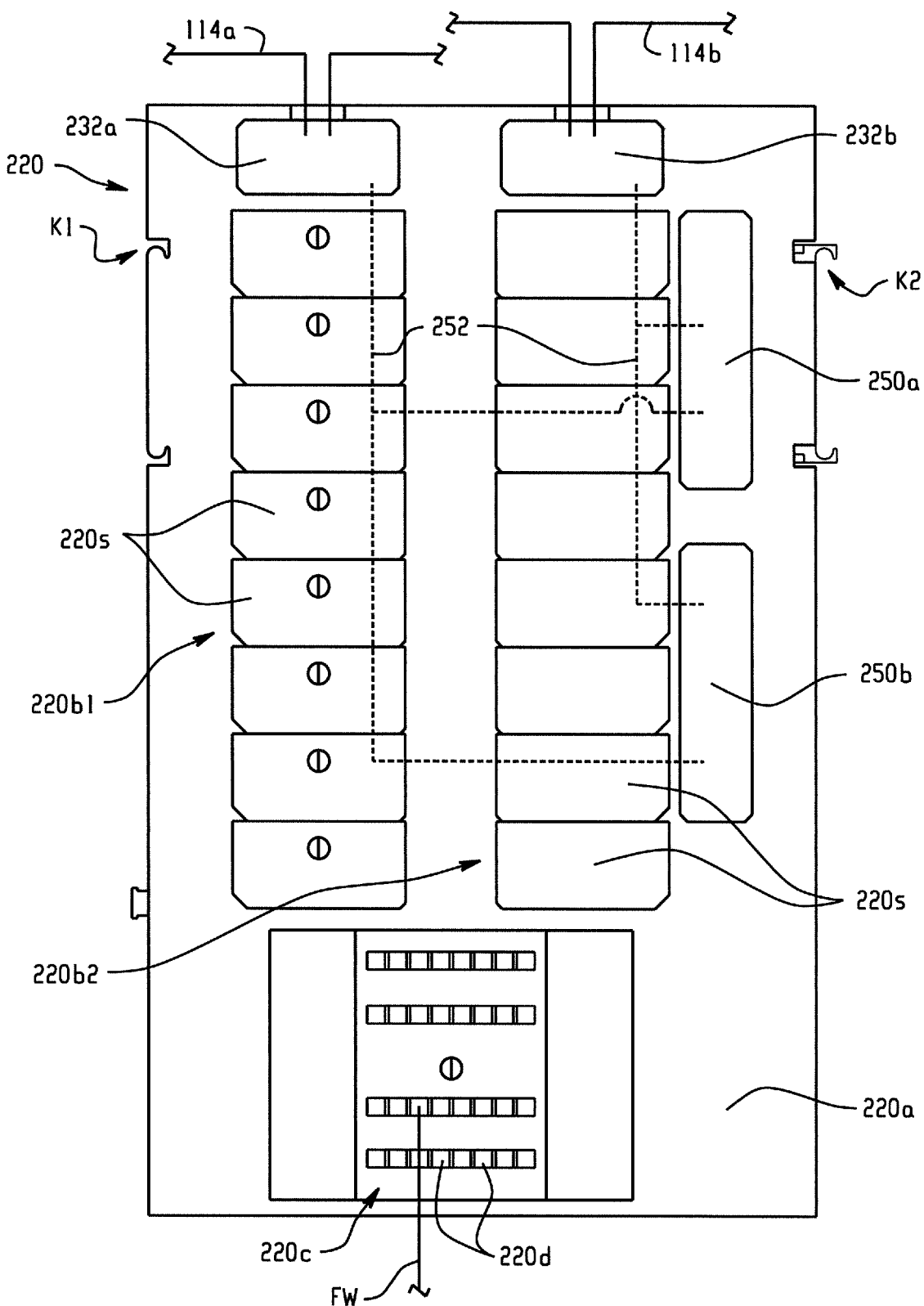
FIGS. 4 and 5 are respective top and isometric views of the configurable I/O device portion of FIG. 3 shown by itself.
Figure 5:
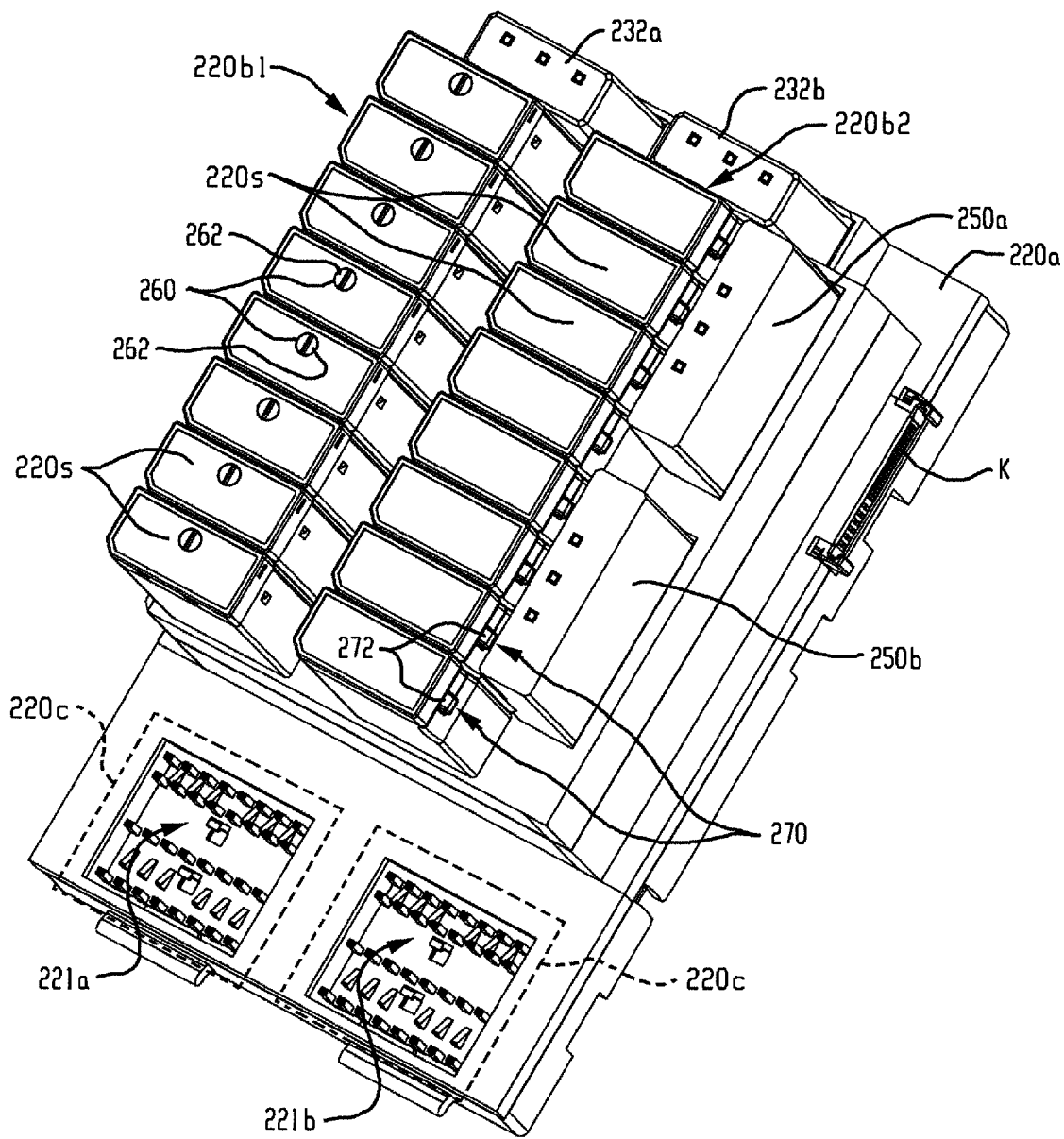

As shown in FIG. 3, the distributed I/O system 110 further comprises a configurable, single-channel I/O device 220 formed in accordance with an embodiment of the present development and comprising a plurality of removable and replaceable single-channel I/O submodules 220s. FIGS. 4 and 5 illustrate the configurable I/O device 220 by itself (in FIG. 5, the terminal block(s) 220c is/are shown only in simplified broken lines). Except as otherwise shown and/or described herein, the I/O device 220 is identical to the I/O device 120 described above, and similar components are identified using reference numbers that are 100 greater than those used above to describe the I/O device 120. The configurable I/O device 220 includes a configurable I/O base 220a adapted to be mounted to the support rail D' or other support structure. The I/O base 220a includes the above-described first and second multi-contact electrical connectors K (first connector K1 and second connector K2) such that the I/O base 220a can be operatively connected to either the adapter base 112a via first connector K1 or another I/O base 120a,220a via first and/or second connectors K1,K2 to form part of the backplane 114.

The configurable I/O device 220 further comprises a terminal block 220c connected to the base 220a. The terminal block 220c includes field wiring connectors 220d, corresponding respectively to the terminal block 120c and its field wiring connectors 120d as described above.

Like the I/O device 120, the configurable I/O device 220 includes first and second independent "I/O module" Ethernet switches 232a,232b (generally referred to as Ethernet switches 232) that each are operably connected to, form part of, and establish the backplane 114. The switches 232a,232b are identical to and function identically to the switches 132a,132b described above except as otherwise noted. Each Ethernet switch 232a,232b is physically connected to the configurable I/O base 220a, preferably by a releasable mechanical connection such as a slot including a backplane connector. The first Ethernet switch 232a is operably connected to and forms part of the first backplane network 114a, and the second Ethernet switch 232b is operably connected to and forms part of the second backplane network 114b. The switches 232 can be powered by a separate electrical power connection through the base 220a and/or using a Power over Ethernet (PoE) connection or other power delivery method through the backplane network 114, itself.

The I/O device 220 further comprises at least two configurable I/O modules such as the illustrated first and second configurable I/O modules 220b1, 220b2 (referred to collectively as configurable I/O modules 220b). Unlike the I/O modules 120b described above, the configurable I/O modules 220b are each defined by and comprise a plurality of separate individual I/O segments or I/O submodules 220s that are each selectively installed on and removable from the I/O base 220a, i.e., a first group or plurality of I/O submodules 220s define the first I/O module 220b1 and a second group or plurality 220s2 of I/O submodules 220s define the second I/O module 220b2. In the illustrated example, the first and second I/O modules 220b1,220b2 each comprise eight, single-channel I/O submodules such that the first and second I/O modules 220b1,220b2 each comprise eight individual I/O data channels. Each of the I/O submodules 220s includes the required electronic circuitry to perform a particular type of data input/output I/O operation, such as DC input, DC output, AC input, AC output, safety input/output, HART input/output, RTD and/or thermocouple input and/or output, or other analog or digital input/output for data and signals. Furthermore, each I/O submodule 220s is associated with a single, dedicated I/O data channel that is operatively connected to a group of one or more wiring connectors 220d of a/the terminal block 220c (e.g., a particular column of wiring connectors 220d). In this manner, a field device FD connected to the one or more wiring connectors 220d associated with a particular I/O data channel will be operatively connected to the corresponding I/O submodule 220s associated with that same channel. As noted above, the I/O submodule 220s is selected to be the appropriate I/O type (analog, digital, etc.) as required for the particular field device FD connected to its associated I/O data channel.

The configurable I/O device 220 further comprises first and second system modules 250a,250b that are each removably mechanically connected to the configurable I/O base 220a by a slot with a connector or other releasable mechanical connection. Each of the first and second system modules 250a,250b is operably connected to both of the first and second backplane networks 114a,114b through a circuit board or other connection located in the configurable I/O base 220a as shown by the broken lines 252. Each of the first and second system modules 250a,250b is further operatively connected to both of the first and second configurable I/O modules 220b1,220b2 and all of the I/O submodules/segments 220s thereof through a circuit board or other connection in the configurable base 220a. Each of the first and second system modules 250a,250b includes electronic circuitry required to communicate input/output data to and from the backplane 114 (the first and second backplane networks 114a,114b) and to and from each configurable I/O module 220b and any particular I/O submodule 220s. The first and second system modules 250a,250b each thus provide a data interface circuit between the backplanes 114a, 114b and each of the single-channel I/O submodules 220s. The first and second system modules 250a,250b are completely redundant with respect to each other such that if one of them should fail, it can be removed from the configurable I/O base 220a and replaced without interruption of the operation of the I/O device 220.

The configurable I/O device can be setup such that the first and second configurable I/O modules 220b1,220b2 are completely redundant with respect to each other or such that any pair or multiple pairs of two single-channel submodules 220s can be made redundant with respect to each other. Accordingly, it is preferred that the submodules 220s of the first I/O module 220b1 be visually aligned in rows (as shown) or otherwise aligned respectively with the submodules 220s of the second I/O module 220b2 to facilitate user association of the redundant submodules 220s with respect to each other. In the case illustrated herein where each single-channel I/O submodule 220s of one of the configurable I/O modules 220b1 is configured to be redundant with a corresponding one of the single-channel I/O submodules 220s of the other configurable submodule 220b2, the first and second configurable I/O modules are 100% redundant with respect to each other and thus are operably connected to and share a single common terminal block 220c that bridges the first and second terminal block mounting locations 221a,221b (FIG. 5) of the configurable I/O base 220a as shown in FIGS. 3 & 4. Alternatively, all of the single-channel I/O submodules 220s of each configurable I/O module 220b1,220b2 can be configured to be independent from all other single-channel I/O submodules 220s such that the first and second configurable I/O modules 220b1,220b2 are 100% independent with respect to each other, in which case first and second independent terminal blocks 220c will be connected to the configurable base 220a (as shown in broken lines in FIG. 5). Redundancy between first and second single-channel I/O submodules 220s is preferably provided using first and second single-channel I/O submodules 220s that are part of different I/O modules 220b (i.e., one of the redundant submodules 220s in the first configurable I/O module 220b1 and the other of the redundant submodules 220s in the second configurable I/O module 220b2), but the redundant single-channel I/O submodules 220s can be provided as part of the same configurable I/O module 220b.

FIG. 5 illustrates first and second different alternative mechanical latching structures for releasably connecting the single-channel I/O submodules 220s to the configurable I/O base 220a. The submodules 220s of the first configurable I/O module 220b1 each includes a twist-latch 260 comprising a slotted head 262 adapted to be engaged by a tool for rotation of the latch 260 to disengage the latch 260 and release the submodule 220s from the base 220a. The submodules 220s of the second configurable I/O module 220b2 each includes a push-button latch 270 comprising a projecting button 272 that is adapted to be manually engaged (e.g., depressed) by a user to disengage the latch 270 and release the submodule 220s from the base 220a. Alternatively, any other latch (or no latch) can be used to secure the submodules 220s to the base 220a.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. An input/output (I/O) device for a distributed modular I/O system, said I/O device comprising:
a base adapted to be connected to an associated support structure;
a terminal block connected to the base and including a plurality of wiring connections adapted to be connected to field wiring of an associated controlled system;
first and second I/O modules each comprising a plurality of removable single-channel I/O submodules that are each releasably connected to the base and each configured for a select I/O operation for input and output of data relative to the associated controlled system, each of said single-channel I/O submodules operatively connected to wiring connections of the terminal block through the base;
first and second network switches connected to the base that are adapted to be respectively connected to first and second backplane circuits;
first and second system modules connected to the base and each respectively connected to both of the first and second network switches and each respectively operatively connected to all of the removable single-channel I/O submodules of both of the first and second I/O modules such that the first and second system modules control communication of I/O data between the first and second network switches and the single-channel I/O submodules.

2. The I/O device as set forth in claim 1, wherein said first and second network switches are releasably connected to the base.

3. The I/O device as set forth in claim 2, wherein said first and second system modules are releasably connected to the base.

4. The I/O device as set forth in claim 3, wherein a first one of the single-channel I/O submodules of the first I/O module is identical to and connected to the same wiring connections of the terminal block as a second one of the single-channel I/O submodules of the second I/O module such that said first and second single-channel I/O submodules form a redundant pair of single-channel I/O submodules each operatively connected to: (i) both of said first and second system modules; and, (ii) both of said first and second network switches.

5. The I/O device as set forth in claim 3, wherein each of the single-channel I/O submodules of the first I/O module is identical to and connected to the same wiring connections of the terminal block as a respectively corresponding one of the single-channel I/O submodules of the second I/O module such that each one of the single-channel I/O submodules of the first I/O module forms a redundant pair with said respectively corresponding one of the single-channel I/O submodules of the second I/O module and such that said first and second I/O modules are identical to each other and are redundantly connected to both: (i) said first and second system modules; and, (ii) said wiring connections of said terminal block.

6. The I/O device as set forth in claim 5, wherein the single-channel I/O submodules each comprise at least one of: a digital input/output submodule, an analog input/output submodule, a safety input/output module, a Highway Addressable Remote Transducer (HART) input/output module, a resistance temperature detector (RTD) input/output module, a thermocouple input/output module.

7. The I/O device as set forth in claim 1, wherein a first one of the single-channel I/O submodules of the first I/O module is identical to and connected to the same wiring connections of the terminal block as a second one of the single-channel I/O submodules of the second I/O module such that said first and second single-channel I/O submodules form a redundant pair of single-channel I/O submodules each operatively connected to: (i) both of said first and second system modules; and, (ii) both of said first and second network switches.

8. The I/O device as set forth in claim 7, wherein each of the single-channel I/O submodules of the first I/O module is identical to and connected to the same wiring connections of the terminal block as a respectively corresponding one of the single-channel I/O submodules of the second I/O module such that each one of the single-channel I/O submodules of the first I/O module forms a redundant pair with said respectively corresponding one of the single-channel I/O submodules of the second I/O module and such that said first and second I/O modules are identical to each other and are redundantly connected to both: (i) said first and second system modules; and, (ii) said wiring connections of said terminal block.

9. The I/O device as set forth in claim 8, wherein the single-channel I/O submodules each comprise at least one of: a digital input/output submodule, an analog input/output submodule, a safety input/output module, a Highway Addressable Remote Transducer (HART) input/output module, a resistance temperature detector (RTD) input/output module, a thermocouple input/output module.

10. The I/O device as set forth in claim 1, wherein each of said single-channel I/O submodules is releasably connected to the base by a selectively releasably mechanical latch comprising a twist-latch or a push-button latch.

\* \* \* \* \*